(12) United States Patent
Lin (10) Patent No.: US 8,164,158 B2
(45) Date of Patent: Apr. 24, 2012

(54) SEMICONDUCTOR DEVICE AND METHOD OF FORMING INTEGRATED PASSIVE DEVICE

(75) Inventor: Yaojian Lin, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 386 days.

(21) Appl. No.: 12/557,811

(22) Filed: Sep. 11, 2009

(65) Prior Publication Data
US 2011/0062549 A1    Mar. 17, 2011

(51) Int. Cl.
*H01L 29/92* (2006.01)
*H01L 2/02* (2006.01)
*H01L 21/56* (2006.01)

(52) U.S. Cl. ........................................ 257/531

(58) Field of Classification Search ................... 257/531, 257/532, 516, E29.343, E21.351, E21.008, 257/E21.022, E21.502, 678–733, 787–796, 257/E23.001–E23.194, E21.499–E21.519, 257/100, E21.503–E21.504, 433, 434, 667; 438/25, 112, 15, 26, 51, 55, 64, 106, 124–127, 438/238, 239, 210, 329, 107, 396
See application file for complete search history.

(56) References Cited

U.S. PATENT DOCUMENTS

| | | | |
|---|---|---|---|
| 5,250,843 A | 10/1993 | Eichelberger | |
| 5,353,498 A | 10/1994 | Fillion et al. | |
| 5,841,193 A | 11/1998 | Eichelberger | |
| 7,227,240 B2 * | 6/2007 | Knapp et al. | 257/531 |
| 7,619,901 B2 | 11/2009 | Eichelberger et al. | |
| 7,951,663 B2 * | 5/2011 | Lin | 438/238 |
| 2004/0195650 A1 * | 10/2004 | Yang et al. | 257/531 |
| 2005/0045988 A1 * | 3/2005 | Koo et al. | 257/531 |
| 2008/0153245 A1 * | 6/2008 | Lin et al. | 438/381 |
| 2009/0072388 A1 | 3/2009 | Tews et al. | |
| 2009/0072411 A1 | 3/2009 | Tews et al. | |
| 2009/0140421 A1 | 6/2009 | Lin et al. | |
| 2010/0065942 A1 * | 3/2010 | Lin et al. | 257/531 |
| 2010/0219519 A1 * | 9/2010 | Owyang et al. | 257/676 |

* cited by examiner

*Primary Examiner* — Dao H Nguyen
*Assistant Examiner* — Tram H Nguyen
(74) *Attorney, Agent, or Firm* — Robert D. Atkins; Patent Law Group: Atkins & Associates, P.C.

(57) ABSTRACT

An IPD semiconductor device has a capacitor formed over and electrically connected to a semiconductor die. An encapsulant is deposited over the capacitor and around the semiconductor die. A first interconnect structure is formed over a first surface of the encapsulant by forming a first conductive layer, forming a first insulating layer over the first conductive layer, and forming a second conductive layer over the first insulating layer. The second conductive layer has a portion formed over the encapsulant at least 50 micrometer away from a footprint of the semiconductor die and wound to operate as an inductor. The portion of the second conductive layer is electrically connected to the capacitor by the first conductive layer. A second interconnect structure is formed over a second surface of the encapsulant. A conductive pillar is formed within the encapsulant between the first and second interconnect structures.

23 Claims, 8 Drawing Sheets

SEMICONDUCTOR DEVICE AND METHOD OF FORMING INTEGRATED PASSIVE DEVICE

FIELD OF THE INVENTION

The present invention relates in general to semiconductor devices and, more particularly, to a semiconductor device and method of forming an integrated passive device.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

Figure 1:
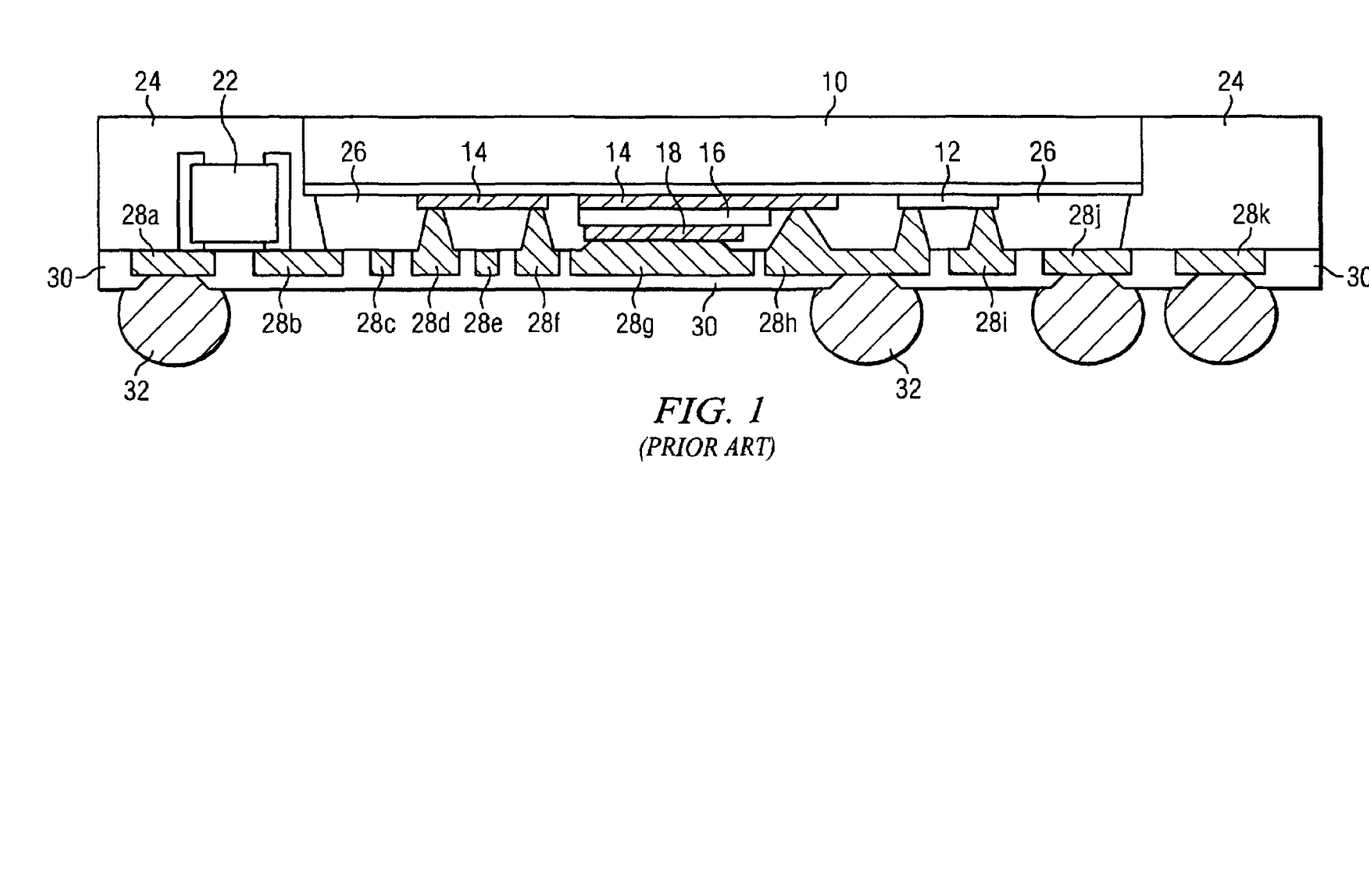
FIG. 1 illustrates a conventional IPD semiconductor device.

FIG. 1 shows a conventional IPD semiconductor device. Semiconductor die 10 contains analog or digital circuits implemented as active devices, passive devices, conductive layers, and dielectric layers formed on a base material, such as silicon, and electrically interconnected according to the electrical design and function of the die. A resistive layer 12, conductive layer 14, resistive layer 16, and insulating layers 18 and 26 are formed below semiconductor die 10. A discrete semiconductor device 22 is mounted adjacent to semiconductor die 10. An encapsulant 24 is deposited using a molding process and then conductive layer 28a-28k is formed over semiconductor die 10. An insulating layer 30 and bumps 32 are formed over conductive layer 28a-28k. Conductive layer 14, resistive layer 16, insulating layer 18, and conductive layer 28d constitute a metal-insulator-metal (MIM) capacitor. Conductive layer 28b-28f is disposed under semiconductor die 10 and wound to exhibit inductive properties.

When forming the IPD, such as an inductor, in a semiconductor package, the bridge of the inductor is typically located beneath the semiconductor die. The IPD construction limits the size of the inductor that can be realized within the package. In addition, to achieve a high-Q inductor, a high resistivity silicon base material is required for semiconductor die 10. Otherwise, the eddy current losses from the inductor can interfere or otherwise adversely influence the operation of the die. The high resistivity substrate adds cost to the manufacturing process.

SUMMARY OF THE INVENTION

A need exists for a large value inductor in a semiconductor package without using a high resistivity semiconductor substrate. Accordingly, in one embodiment, the present invention is a method of making a semiconductor device comprising the steps of providing a semiconductor die having a resistivity, and forming a first capacitor over the semiconductor die. The first capacitor is electrically connected to the semiconductor die. The method further includes the step of depositing an encapsulant over the first capacitor and around the semiconductor die. The encapsulant has a higher resistivity than the resistivity of the semiconductor die. The method further includes the step of forming a first interconnect structure over a first surface of the encapsulant by forming a first conductive layer electrically connected to the first capacitor, forming a first insulating layer over the first conductive layer, and forming a second conductive layer over the first insulating layer. The second conductive layer has a portion formed over the encapsulant a predetermined distance away from a footprint of the semiconductor die and wound to operate as an inductor.

The portion of the second conductive layer is electrically connected to the first capacitor by the first conductive layer.

In another embodiment, the present invention is a method of making a semiconductor device comprising the steps of providing a semiconductor die, forming a first capacitor over the semiconductor die, depositing an encapsulant over the first capacitor and around the semiconductor die, forming a first conductive layer over a first surface of the encapsulant, forming a first insulating layer over the first conductive layer, and forming a second conductive layer over the first insulating layer. The second conductive layer has a portion formed a predetermined distance away from a footprint of the semiconductor die and wound to operate as an inductor. The portion of the second conductive layer is electrically connected to the first conductive layer.

In another embodiment, the present invention is a method of making a semiconductor device comprising the steps of providing a semiconductor die, forming a capacitor over the semiconductor die, depositing an encapsulant over the capacitor and around the semiconductor die, and forming a first interconnect structure over a first surface of the encapsulant. The first interconnect structure includes an inductor formed a predetermined distance away from a footprint of the semiconductor die.

In another embodiment, the present invention is a semiconductor device comprising a semiconductor die and capacitor formed over the semiconductor die. An encapsulant is deposited over the capacitor and around the semiconductor die. A first interconnect structure is formed over a first surface of the encapsulant. The first interconnect structure including an inductor formed a predetermined distance away from a footprint of the semiconductor die.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along nonfunctional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
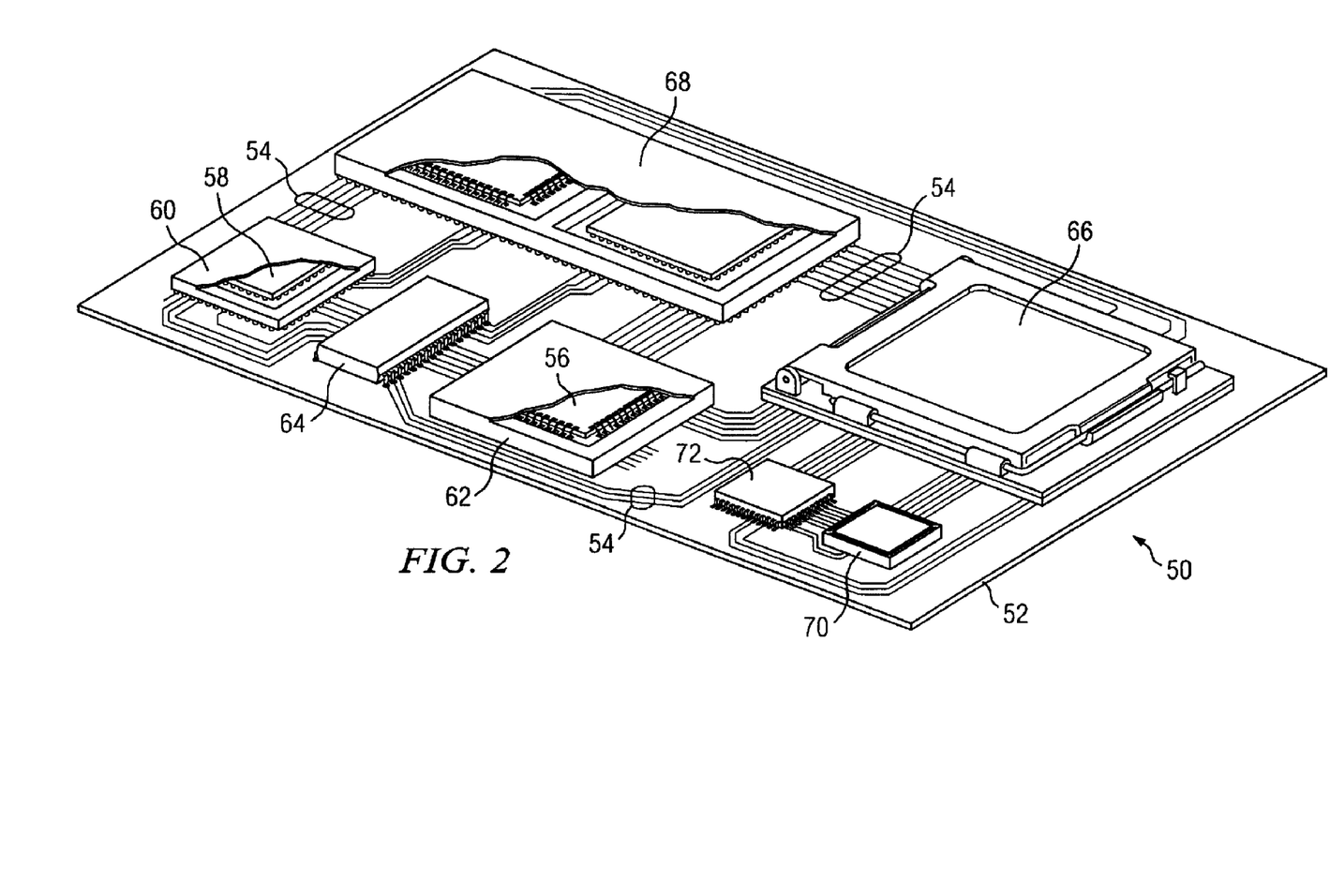
FIG. 2 illustrates a PCB with different types of packages mounted to its surface.

FIG. 2 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 2 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
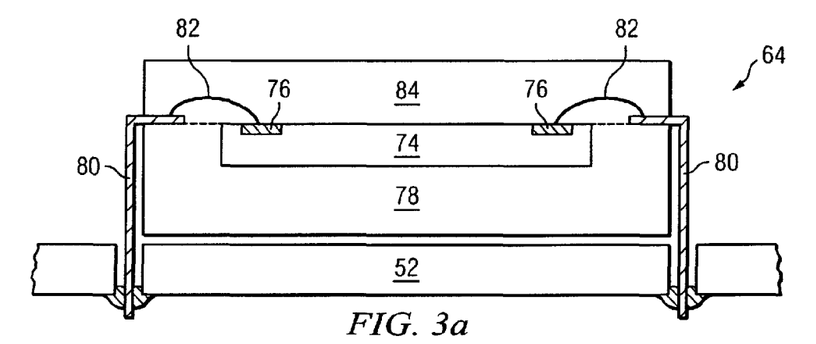
FIGS. 3a-3c illustrate further detail of the representative semiconductor packages mounted to the PCB.

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

Figure 3B:
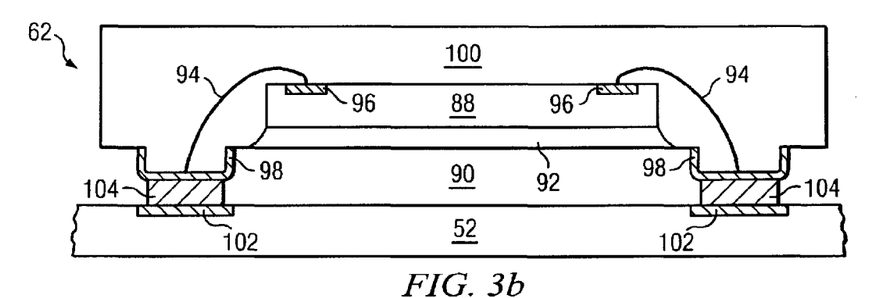

FIG. 3b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

Figure 3C:
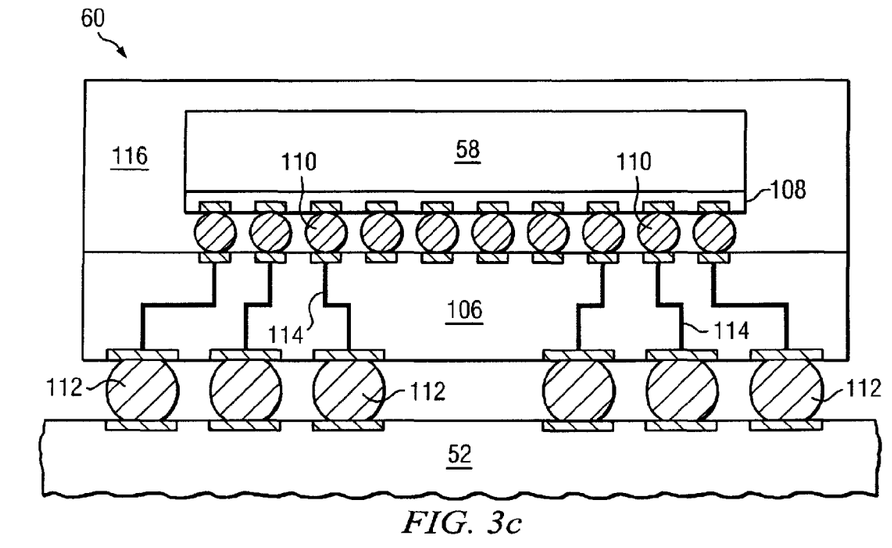

In FIG. 3c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

FIGS. 4a-4g illustrate, in relation to FIGS. 2 and 3a-3c, a process of forming an IPD semiconductor device with a capacitor embedded within the encapsulant and large value inductor formed away from a footprint of the semiconductor die. Semiconductor die or wafer 118 has contact pads 119 on active surface 120 oriented facing upward. Active surface 120 contains analog or digital circuits implemented as active devices, passive devices, conductive layers, and dielectric layers formed on a base material, such as silicon, and electrically interconnected according to the electrical design and function of the die. For example, the circuit may include one or more transistors, diodes, and other circuit elements formed within active surface 120 to implement analog circuits or digital circuits, such as digital signal processor (DSP), ASIC, memory, or other signal processing circuit. The base material of semiconductor die 118 has relatively low resistivity, e.g., less than 100 ohm-cm, for lower manufacturing cost. Semiconductor die 118 may also contain IPD, such as inductors, capacitors, and resistors, for RF signal processing. A typical RF system requires multiple IPDs in one or more semiconductor packages to perform the necessary electrical functions. Alternatively, insulation layer 122, such as $SiO_2$, is blanket deposited over surface 120 without active circuitry.

Figure 4A:
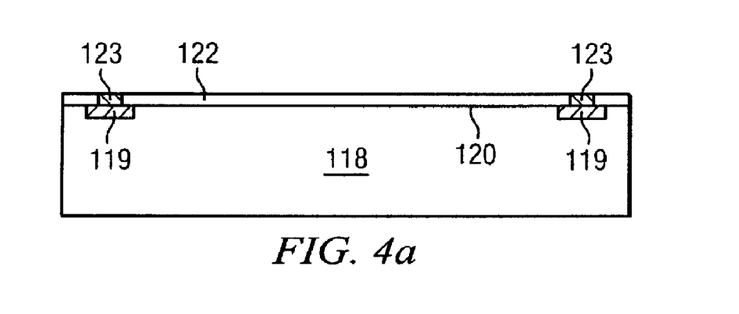
FIGS. 4a-4g illustrate a process of forming an IPD semiconductor device with a capacitor embedded within the encapsulant and inductor formed away from the semiconductor die.

Semiconductor die 118 can be flipchip-type die or other semiconductor die without bumps. In the case of a flipchip die, an insulating layer 122 is formed over active surface 120 of semiconductor die 118. The insulating layer 122 can be one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. The insulating layer 122 is formed using printing, spin coating, spray coating, sintering or thermal oxidation. A portion of insulating layer 122 is removed by an etch development process to expose contact pads 119. A conductive layer 123 is formed over contact pads 119 of semiconductor die 118.

Figure 4B:
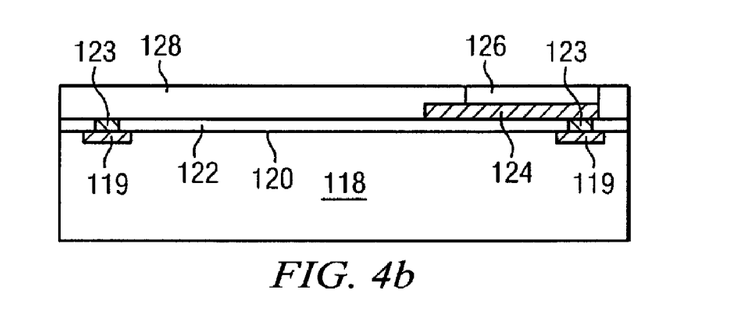

In FIG. 4b, an electrically conductive layer 124 is patterned and deposited over insulating layer 122 using electrolytic plating, electroless plating, lamination, or other suitable metal deposition process. Conductive layer 124 can be one or more layers of Al, TaSi, Cu, Sn, Ni, Au, Ag, or other suitable electrically conductive material. Conductive layer 124 is electrically connected through conductive layer 123 to contact pads 119 of semiconductor die 118.

An insulating layer 126 is formed over conductive layer 124. The insulating layer 126 can be one or more layers of $SiO_2$, $Si_3N_4$, SiON, $Ta_2O_5$, $Al_2O_3$, polyimide, benzocyclobutene (BCB), polybenzoxazoles (PBO), or other suitable dielectric material. The insulating layer 126 can be patterned using printing, sintering, or thermal oxidation. Alternatively, the insulation layer 126 can be blanket deposited without patterning inside the die area.

An optional encapsulant or polymer dielectric layer 128 is deposited over insulating layer 122, conductive layer 124, and insulating layer 126 using a paste printing, compressive molding, vacuum lamination, spin coating, or other suitable applicator. Encapsulant 128 can be photosensitive polymer resist, such as polyimide, BCB, WPR, PBO, and epoxy based resist, or polymer composite material, such as epoxy resin with filler, epoxy acrylate with filler, or polymer with proper filler. Encapsulant 128 has a resistivity greater than 1 E12 ohm.cm, low loss tangent, low dielectric constant, coefficient of thermal expansion (CTE) of 3-80 ppm/° C., and high thermal conductivity. Encapsulant 128 is non-conductive and environmentally protects the semiconductor device from external elements.

Figure 4C:
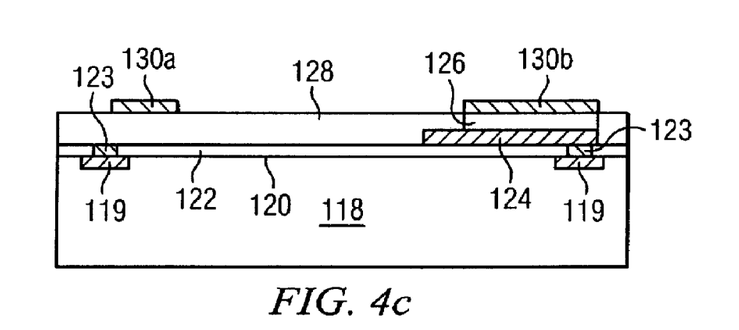

In FIG. 4c, an optional electrically conductive layer 130a and 130b is patterned and deposited over insulating layer 126 using electrolytic plating, electroless plating, lamination, or other suitable metal deposition process. Conductive layer 130a and 130b can be one or more layers of Al, Cu, Sn, Ni, Au, Ag, or other suitable electrically conductive material.

Figure 4D:
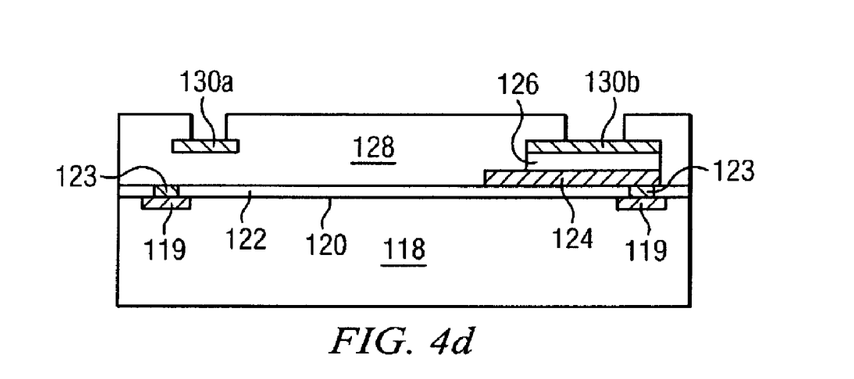

Additional encapsulant 128 is formed over conductive layer 130a and 130b, as shown in FIG. 4d. A portion of encapsulant 128 is removed by an etch development process to expose conductive layer 130a and 130b.

The assembly described in FIGS. 4a-4d is attached to temporary carrier 117 with thermal or light releasable tape. Carrier 117 contains temporary or sacrificial base material such as silicon, polymer, polymer composite, metal, ceramic, glass, glass epoxy, beryllium oxide, or other suitable low-cost, rigid material or bulk semiconductor material for structural support.

Figure 4E:
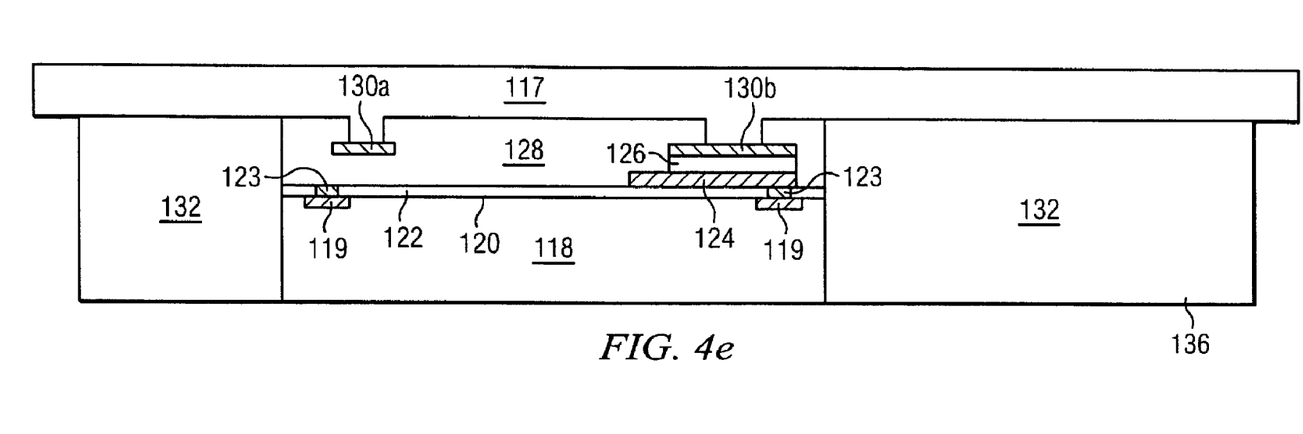

An encapsulant or molding compound 132 is deposited over carrier 117 and around semiconductor die 118 and encapsulant 128 using a paste printing, compressive molding, transfer molding, liquid encapsulant molding, vacuum lamination, spin coating, or other suitable applicator. Encapsulant 132 can be polymer composite material, such as epoxy resin with filler, epoxy acrylate with filler, or polymer with proper filler. Encapsulant 132 has a resistivity greater than 1 E12 ohm.cm, low loss tangent, low dielectric constant, CTE of 3-80 ppm/° C., and high thermal conductivity. Encapsulant 132 is non-conductive and environmentally protects the semiconductor device from external elements and contaminants. The temporary carrier 117 is removed after depositing encapsulant 132.

Figure 4F:
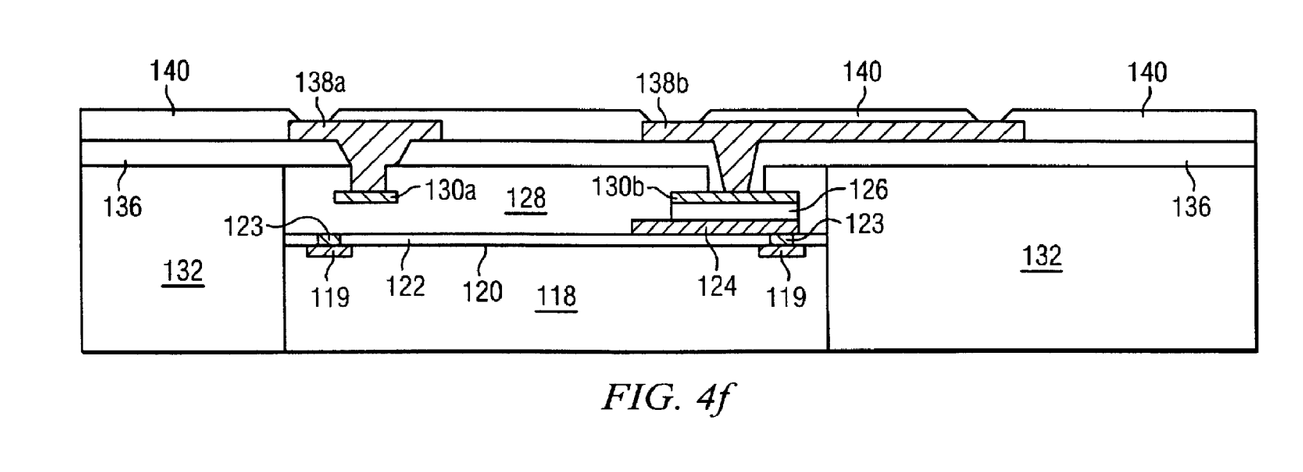

In FIG. 4f, an insulating or passivation layer 136 is formed over encapsulant 128 and encapsulant 132 after debonding the molded substrate with embedded semiconductor die 118 from carrier 117. The insulating layer 136 can be one or more layers of $SiO_2$, $Si_3N_4$, SiON, $Ta_2O_5$, $Al_2O_3$, photosensitive polymer dielectric resist, such as PBO, WPR, or other low temperature cured epoxy based dielectric resist. The insulating layer 136 is formed using printing, spin coating, spray coating, or sintering. A portion of insulating layer 136 is removed by an etch development process to expose conductive layer 130a and 130b.

An electrically conductive layer 138a and 138b is patterned and deposited over insulating layer 136 and conductive layer 130a-130b using electrolytic plating, electroless plating, lamination, or other suitable metal deposition process. Conductive layer 138a-138b can be one or more layers of Al, Ti, TiW, Cu, Sn, Ni, Au, Ag, or other suitable electrically conductive material. Conductive layer 138a is electrically connected to conductive layer 130a, and conductive layer 138b is electrically connected to conductive layer 130b.

An insulating or passivation layer 140 is formed over insulating layer 136 and conductive layer 138a-138b. The insulating layer 140 can be one or more layers of $SiO_2$, $Si_3N_4$, SiON, $Ta_2O_5$, $Al_2O_3$, photosensitive polymer dielectric resist, such as PBO, WPR, or other low temperature cured epoxy based dielectric resist. The insulating layer 140 is formed using printing, spin coating, spray coating, or sintering. A portion of insulating layer 140 is removed by an etch development process to expose conductive layer 138a and 138b.

Figure 4G:
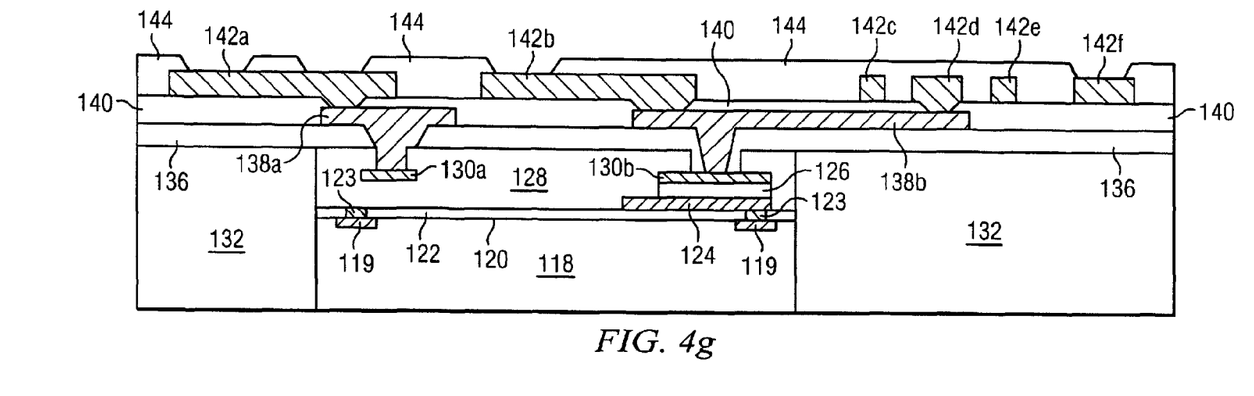

In FIG. 4g, an electrically conductive layer 142a-142f is patterned and deposited over insulating layer 140 and conductive layer 138a-138b using electrolytic plating, electroless plating, lamination, or other suitable metal deposition process. The individual portions of conductive layer 142 can be electrically common or electrically isolated depending on the connectivity of the individual semiconductor die. Conductive layer 142a-142f can be one or more layers of Al, Ti, TiW, TiN, Cu, Sn, Ni, Au, Ag, or other suitable electrically conductive material. Conductive layer 142a is electrically connected to conductive layer 138a, and conductive layer 142b is electrically connected to conductive layer 138b. Conductive layers 138a, 138b, 142a, and 142b operate as redistribution layers (RDL) to extend interconnectivity.

An insulating or passivation layer 144 is formed over insulating layer 140 and conductive layer 142a-142f. The insulating layer 144 can be one or more layers of SiO2, Si3N4, SiON, Ta2O5, Al2O3, photosensitive polymer dielectric resist, such as PBO, WPR, liquid solder mask, or other low temperature cured epoxy based dielectric resist. The insulating layer 144 is formed using printing, spin coating, spray coating, sintering or thermal oxidation. A portion of insulating layer 144 is removed by an etch development process to expose conductive layer 142a, 142b, and 142f.

Figure 5A:
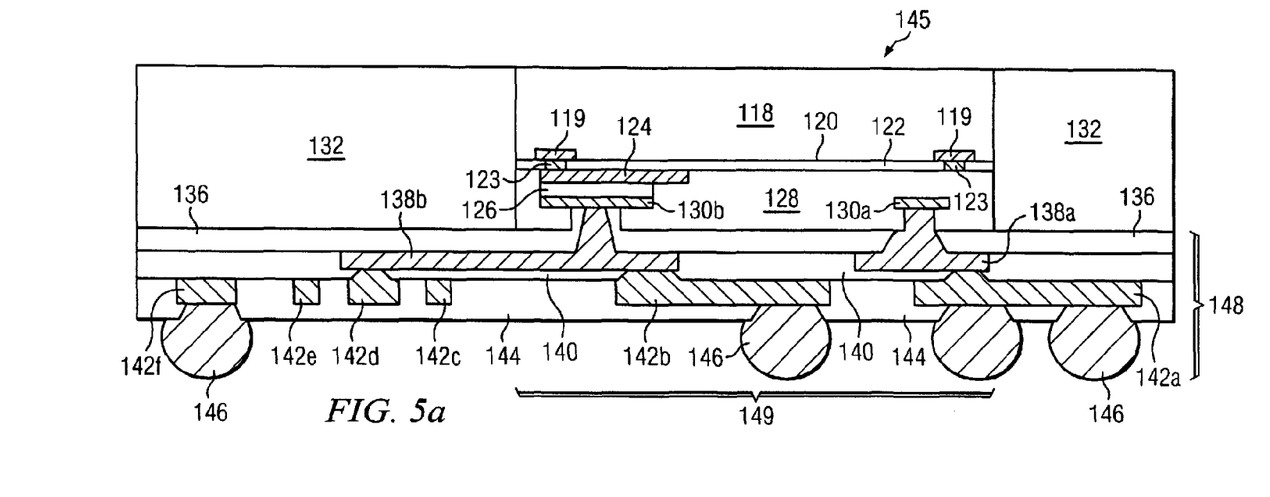
FIGS. 5a-5b illustrate the IPD semiconductor device with the capacitor embedded within the encapsulant and inductor formed away from the semiconductor die.

In FIG. 5a, semiconductor device 145 described in FIGS. 4a-4g is inverted and an electrically conductive bump material is deposited over conductive layer 142a, 142b, and 142f using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 142 using a suitable attachment or bonding process. In one embodiment, the bump material is reflowed by heating the material above its melting point to form spherical balls or bumps 146. In some applications, bumps 146 are reflowed a second time to improve electrical contact to conductive layer 142. The bumps can also be compression bonded to conductive layer 142. The height of bumps 146 is at least 100 micrometers (μm). Bumps 146 represent one type of interconnect structure that can be formed over conductive layer 142. The interconnect structure can also use bond wires, stud bump, micro bump, or other electrical interconnect. The combination of conductive layers 138 and 142, insulating layers 136, 140, and 144, and bumps 146 constitute a bottom-side build-up interconnect structure 148.

Semiconductor device 145 contains one or more passive circuit elements or IPDs for RF signal processing. In one embodiment, conductive layer 124, insulating layer 126, and optional conductive layer 130b is a MIM capacitor. The MIM capacitor is embedded in the high-resistivity encapsulant 128, which in combination with the high-resistivity encapsulant 132 forms a substrate for build-up interconnect structure 148. In another embodiment, a trench capacitor can be embedded in encapsulant 128. The embedded capacitor 124-130 is thus pre-formed on semiconductor die 118 before encapsulation and before formation of build-up interconnect structure 148. Conductive layers 130a, 138a, and 142a provide electrical interconnect for additional RF or baseband signal processing.

Figure 5B:
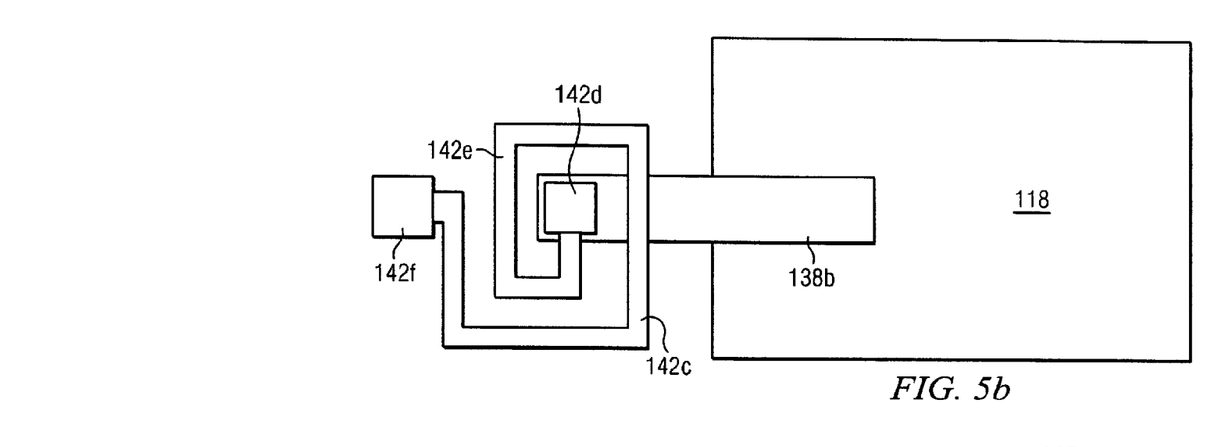

The individual sections of conductive layer 142 can be wound or coiled in plan-view to produce or exhibit inductive properties. For example, conductive layer 142c-142e constitute a wound inductor, as shown in plan-view in FIG. 5b. Conductive layer 142c-142e is formed over encapsulant 132 a predetermined horizontal distance away from footprint or downward projection 149 of semiconductor die 118. The inductor 142c-142e is located at least 50 μm away from footprint 149 of embedded MIM capacitor 124-130 and semiconductor die 118, and electrically connected to the embedded MIM capacitor 124-130 and semiconductor die 118 by way of the RDL bridge formed by conductive layer 138b. By locating the inductor 142c-142e away from the low resistivity semiconductor die 118, and separated by the high-resistivity encapsulant 128 and encapsulant 132, the eddy current losses induced by the inductor do not interfere or otherwise adversely influence the operation of the die. In addition, since no interconnect bump 146 is formed below the inductor 142c-142e, the thickness of conductive layer 142c-142e can be at least 100 μm for a larger value inductor.

The IPD semiconductor device 145 provides electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed over a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions.

Figure 6:
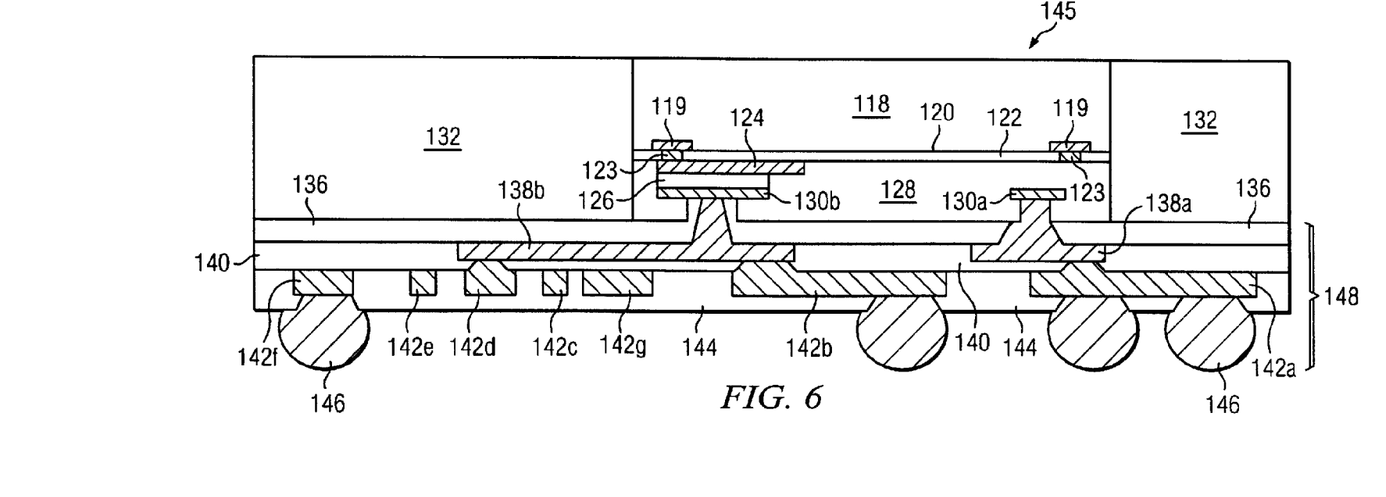
FIG. 6 illustrates a MIM capacitor formed within the bottom-side build-up interconnect structure.

FIG. 6 shows an alternate embodiment of the semiconductor structure described in FIG. 4a-4g and 5a-5b. In FIG. 6, conductive layer 142 also contains portion 142g. The combination of conductive layer 142g, insulating layer 140, and conductive layer 138b forms another MIM capacitor for additional RF signal processing.

Figure 7:
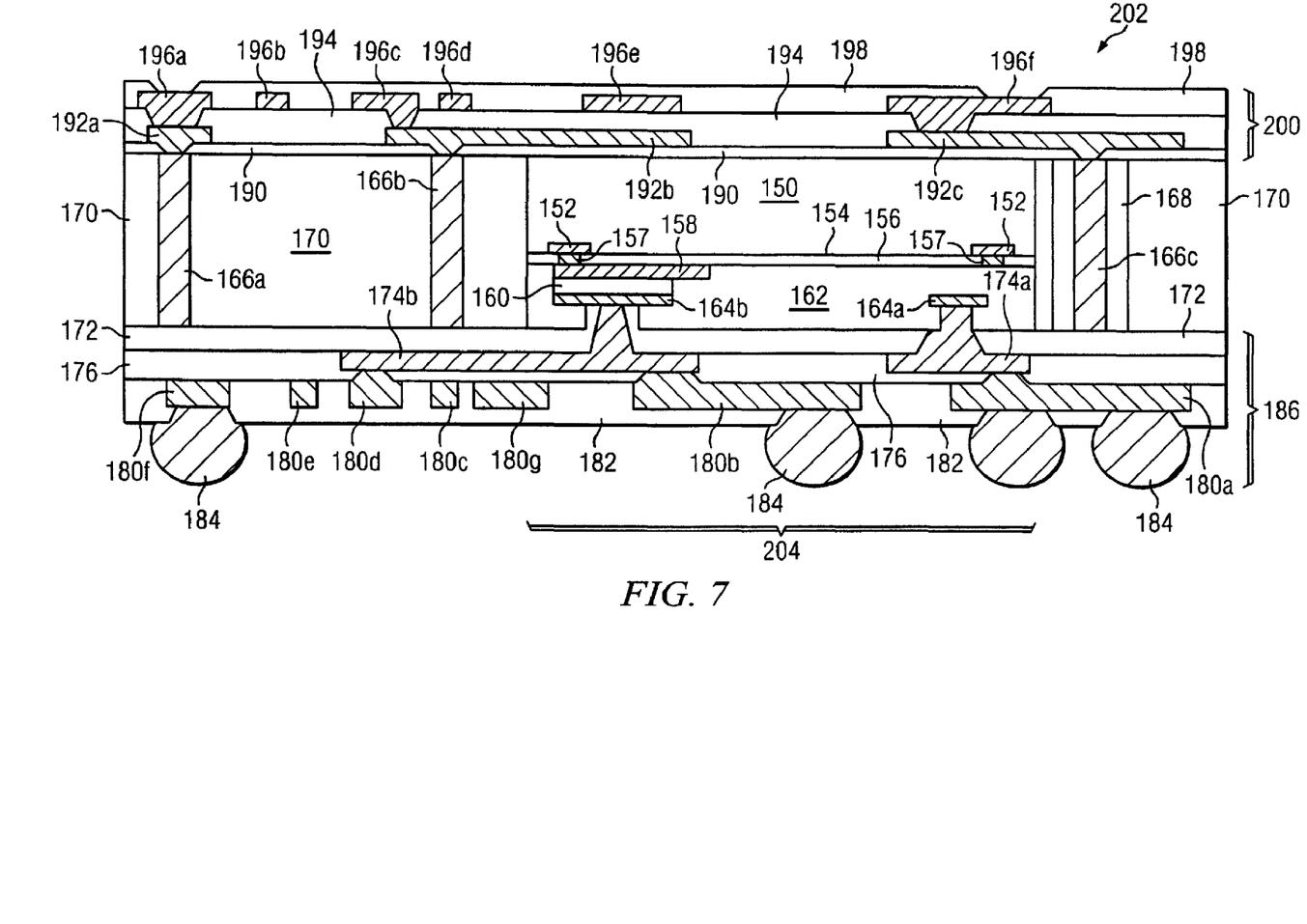
FIG. 7 illustrates the IPD semiconductor device with topside and bottom-side build-up interconnect structures and interconnecting conductive pillars.

Another embodiment of the IPD semiconductor device is shown in FIG. 7. Semiconductor die or wafer 150 has contact pads 152 on active surface 154 oriented facing upward. Active surface 154 contains analog or digital circuits implemented as active devices, passive devices, conductive layers, and dielectric layers formed on a base material, such as silicon, and electrically interconnected according to the electrical design and function of the die. For example, the circuit may include one or more transistors, diodes, and other circuit elements formed within active surface 154 to implement analog circuits or digital circuits, such as DSP, ASIC, memory, or other signal processing circuit. The base material of semiconductor die 150 has relatively low resistivity, e.g., less than 100 ohm-cm, for lower manufacturing cost. Semiconductor die 150 may also contain IPD, such as inductors, capacitors, and resistors, for RF signal processing. A typical RF system requires multiple IPDs in one or more semiconductor packages to perform the necessary electrical functions.

Semiconductor die 150 can be flipchip-type die or other semiconductor die without bumps. In the case of a flipchip die, an insulating layer 156 is formed over active surface 154 of semiconductor die 150. The insulating layer 156 can be one or more layers of SiO2, Si3N4, SiON, Ta2O5, Al2O3, or other material having similar insulating and structural properties. The insulating layer 156 is formed using printing, spin coating, spray coating, sintering or thermal oxidation. A portion of insulating layer 156 is removed by an etch development process to expose contact pads 152. A conductive layer 157 is formed over contact pads 152 of semiconductor die 150.

An electrically conductive layer 158 is patterned and deposited over insulating layer 156 using electrolytic plating, electroless plating, lamination, or other suitable metal deposition process. Conductive layer 158 can be one or more layers of Al, TaSi, Cu, Sn, Ni, Au, Ag, or other suitable electrically conductive material. Conductive layer 158 is electrically connected through conductive layer 157 to contact pads 152 of semiconductor die 150.

An insulating layer 160 is formed over conductive layer 158. The insulating layer 160 can be one or more layers of SiO2, Si3N4, SiON, Ta2O5, Al2O3, polyimide, BCB, PBO, or other suitable dielectric material. The insulating layer 160 is patterned using printing, sintering, or thermal oxidation. Alternatively, the insulation layer 160 can be blanket deposited without patterning inside the die area.

An optional encapsulant or polymer dielectric layer 162 is deposited over insulating layer 156, insulating layer 160, and conductive layer 158 using a paste printing, compressive molding, vacuum lamination, spin coating, or other suitable applicator. Encapsulant 162 can be photosensitive polymer resist, such as polyimide, BCB, WPR, PBO, and epoxy based resist, or polymer composite material, such as epoxy resin with filler, epoxy acrylate with filler, or polymer with proper filler. Encapsulant 162 has a high resistivity greater than 1 E12 ohm.cm, low loss tangent, low dielectric constant, CTE of 3-80 ppm/° C., and high thermal conductivity. Encapsulant 162 is non-conductive and environmentally protects the semiconductor device from external elements.

An optional electrically conductive layer 164a and 164b is patterned and deposited over insulating layer 160 using electrolytic plating, electroless plating, lamination, or other suitable metal deposition process. Conductive layer 164a and 164b can be one or more layers of Al, Cu, Sn, Ni, Au, Ag, or other suitable electrically conductive material.

Additional encapsulant 162 is formed over conductive layer 164a and 164b. A portion of encapsulant 162 is removed by an etch development process to expose conductive layer 164a and 164b.

A temporary carrier is attached over encapsulant 162 with thermal or light releasable tape. An encapsulant or molding compound 170 is deposited over the temporary carrier and semiconductor die 150 and encapsulant 162 using a paste printing, compressive molding, transfer molding, liquid encapsulant molding, vacuum lamination, spin coating, or other suitable applicator. Encapsulant 170 can be polymer composite material, such as epoxy resin with filler, epoxy acrylate with filler, or polymer with proper filler. Encapsulant 170 has a high resistivity greater than 1 E12 ohm.cm, low loss tangent, low dielectric constant, CTE of 3-80 ppm/° C., and high thermal conductivity. Encapsulant 170 is non-conductive and environmentally protects the semiconductor device from external elements and contaminants. The temporary carrier is removed after depositing encapsulant 170.

A plurality of vias is formed in encapsulant 170 and filled with conductive material to form conductive pillars 166a, 166b, and 166c. Conductive pillar 166c is surrounded by insulating layer 168. An insulating or passivation layer 172 is formed over a first side of encapsulant 162 and encapsulant 170 after debonding the molded substrate with embedded semiconductor die 150 from the temporary carrier. The insulating layer 172 can be one or more layers of SiO2, Si3N4, SiON, Ta2O5, Al2O3, photosensitive polymer dielectric resist, such as PBO, WPR, liquid solder mask, or other low temperature cured epoxy based dielectric resist. The insulating layer 172 is formed using printing, spin coating, spray coating, or sintering. A portion of insulating layer 172 is removed by an etch development process to expose conductive layer 164a and 164b.

An electrically conductive layer 174a and 174b is patterned and deposited over insulating layer 172 and conductive layer 164a-164b using electrolytic plating, electroless plating, lamination, or other suitable metal deposition process. Conductive layer 174a-174b can be one or more layers of Al, Ti, TiW, Cu, Sn, Ni, Au, Ag, or other suitable electrically conductive material. Conductive layer 174a is electrically connected to conductive layer 164a, and conductive layer 174b is electrically connected to conductive layer 164b.

An insulating or passivation layer 176 is formed over insulating layer 172 and conductive layer 174a-174b. The insulating layer 176 can be one or more layers of SiO2, Si3N4, SiON, Ta2O5, Al2O3, photosensitive polymer dielectric resist, such as PBO, WPR, liquid solder mask, or other low temperature cured epoxy based dielectric resist. The insulating layer 176 is formed using printing, spin coating, spray coating, sintering or thermal oxidation. A portion of insulating layer 176 is removed by an etch development process to expose conductive layer 174a and 174b.

An electrically conductive layer 180a-180g is patterned and deposited over insulating layer 176 and conductive layer 174a-174b using electrolytic plating, electroless plating, lamination, or other suitable metal deposition process. The individual portions of conductive layer 180 can be electrically common or electrically isolated depending on the connectivity of the individual semiconductor die. Conductive layer 180a-180g can be one or more layers of Al, Ti, TiW, TiN, Cu, Sn, Ni, Au, Ag, or other suitable electrically conductive material. Conductive layer 180a is electrically connected to conductive layer 174a, and conductive layer 180b is electrically connected to conductive layer 174b. Conductive layers 174a, 174b, 180a, and 180b operate as RDLs to extend interconnectivity.

An insulating or passivation layer 182 is formed over insulating layer 176 and conductive layer 180a-180g. The insulating layer 182 can be one or more layers of SiO2, Si3N4, SiON, Ta2O5, Al2O3, photosensitive polymer dielectric resist, such as PBO, WPR, liquid solder mask, or other low temperature cured epoxy based dielectric resist. The insulating layer 182 is formed using printing, spin coating, spray coating, sintering or thermal oxidation. A portion of insulating layer 182 is removed by an etch development process to expose conductive layer 180a, 180b, and 180f.

An electrically conductive bump material is deposited over conductive layer 180a, 180b, and 180f using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 180 using a suitable attachment or bonding process. In one embodiment, the bump material is reflowed by heating the material above its melting point to form spherical balls or bumps 184. In some applications, bumps 184 are reflowed a second time to improve electrical contact to conductive layer 180. The bumps can also be compression bonded to conductive layer 180. The height of bumps 184 is at least 100 µm. Bumps 184 represent one type of interconnect structure that can be formed over conductive layer 180. The interconnect structure can also use bond wires, stud bump, micro bump, or other electrical interconnect. The combination of conductive layers 174 and 180, insulating layers 172, 176, and 182, and bumps 184 constitute a bottom-side build-up interconnect structure 186.

An insulating or passivation layer 190 is formed over a second side of encapsulant 170 opposite build-up interconnect structure 186. The insulating layer 190 can be one or more layers of SiO2, Si3N4, SiON, Ta2O5, Al2O3, photosensitive polymer dielectric resist, such as PBO, WPR, liquid solder mask, or other low temperature cured epoxy based dielectric resist. The insulating layer 190 is formed using printing, spin coating, spray coating, sintering or thermal oxidation. A portion of insulating layer 190 is removed by an etch development process to expose conductive pillars 166a-166c.

An electrically conductive layer 192a-192c is patterned and deposited over insulating layer 190 and conductive pillars 166a-166c using electrolytic plating, electroless plating, lamination, or other suitable metal deposition process. Conductive layer 192a-192c can be one or more layers of Al, Cu, Sn, Ni, Au, Ag, or other suitable electrically conductive material. Conductive layer 192a-192c is electrically connected through conductive pillars 166a-166c, respectively, which in turn electrically connect to conductive layer 174a-174b.

An insulating or passivation layer 194 is formed over insulating layer 190 and conductive layer 192. The insulating layer 194 can be one or more layers of SiO2, Si3N4, SiON, Ta2O5, Al2O3, photosensitive polymer dielectric resist, such as PBO, WPR, liquid solder mask, or other low temperature cured epoxy based dielectric resist. The insulating layer 194 is formed using printing, spin coating, spray coating, sintering or thermal oxidation. A portion of insulating layer 194 is removed by an etch development process to expose conductive layer 192.

An electrically conductive layer 196a-196f is patterned and deposited over insulating layer 194 and conductive layer 192a-192c using electrolytic plating, electroless plating, lamination, or other suitable metal deposition process. The individual portions of conductive layer 196 can be electrically common or electrically isolated depending on the connectivity of the individual semiconductor die. Conductive layer 196a-196f can be one or more layers of Al, Cu, Sn, Ni, Au, Ag, or other suitable electrically conductive material. Conductive layer 196a is electrically connected to conductive layer 192a, conductive layer 196c is electrically connected to conductive layer 192b, and conductive layer 196f is electrically connected to conductive layer 192c. Conductive layers 192b and 192c operate as RDLs to extend interconnectivity.

An insulating or passivation layer 198 is formed over insulating layer 194 and conductive layer 196. The insulating layer 198 can be one or more layers of SiO2, Si3N4, SiON, Ta2O5, Al2O3, photosensitive polymer dielectric resist, such as PBO, WPR, liquid solder mask, or other low temperature cured epoxy based dielectric resist. The insulating layer 198 is formed using printing, spin coating, spray coating, sintering or thermal oxidation. A portion of insulating layer 198 is removed by an etch development process to expose conductive layer 196. The combination of conductive layers 192 and 196, insulating layers 190 and 198 constitute a topside build-up interconnect structure 200.

Semiconductor device 202 contains one or more passive circuit elements or IPDs for RF signal processing. In one embodiment, conductive layer 158, insulating layer 160, and conductive layer 164b is a MIM capacitor. The MIM capacitor is embedded in the high-resistivity encapsulant 162, which in combination with the high-resistivity encapsulant 170 forms a substrate for build-up interconnect structure 186. In another embodiment, a trench capacitor can be embedded in encapsulant 162. The embedded capacitor 158-164 is thus pre-formed on semiconductor die 150 before encapsulation and before formation of build-up interconnect structure 186. The combination of conductive layer 180g, insulating layer 176, and conductive layer 174b, and the combination of conductive layer 196e, insulating layer 194, and conductive layer 192b, each form another MIM capacitor for additional RF signal processing. Conductive layers 164a, 174a, and 180a provide electrical interconnect for additional RF or baseband signal processing.

The individual sections of conductive layer 180 can be wound or coiled in plan-view to produce or exhibit the desired properties of an inductor. For example, conductive layer 180c-180e constitutes a wound inductor, similar to FIG. 5b.

Likewise, conductive layer 196b-196d constitutes another wound inductor. Conductive layer 180c-180e is formed over encapsulant 170 a predetermined horizontal distance away from a footprint or downward projection 204 of semiconductor die 150. The inductor 180c-180e is located at least 50 µm away from the footprint of embedded MIM capacitor 158-164 and semiconductor die 150, and electrically connected to Conductive to the embedded MIM capacitor 158-164 and semiconductor die 150 by way of the RDL bridge formed by conductive layer 174b. By locating the inductor 180c-180e away from the low resistivity semiconductor die 150, and separated by the high-resistivity encapsulant 162 and encapsulant 170, the eddy current losses induced by the inductor do not interfere or otherwise adversely influence the operation of the die. In addition, since no interconnect bump 184 is formed below the inductor 180c-180e, the thickness of conductive layer 180c-180e can be at least 100 µm for a larger value inductor.

The IPD semiconductor device 202 provides electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed over a same substrate, allowing multi-band operation. For example, two or more baluns are used in a quad-band for mobile phones or other GSM communications, each balun dedicated for a frequency band of operation of the quad-band device. A typical RF system requires multiple IPDs and other high frequency circuits in one or more semiconductor packages to perform the necessary electrical functions.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
   providing a semiconductor die having a resistivity;
   forming a first capacitor over the semiconductor die, the first capacitor being electrically connected to the semiconductor die;
   depositing an encapsulant over the first capacitor and around the semiconductor die, the encapsulant having a higher resistivity than the resistivity of the semiconductor die; and
   forming a first interconnect structure over a first surface of the encapsulant by,
   (a) forming a first conductive layer electrically connected to the first capacitor,
   (b) forming a first insulating layer over the first conductive layer, and
   (c) forming a second conductive layer over the first insulating layer, the second conductive layer having a portion formed over the encapsulant a predetermined distance away from a footprint of the semiconductor die and wound to operate as an inductor, the portion of the second conductive layer being electrically connected to the first capacitor by the first conductive layer.

2. The method of claim 1, wherein the portion of the first conductive layer wound to operate as an inductor is at least 50 micrometer away from the footprint of the semiconductor die.

3. The method of claim 1, wherein forming the first capacitor includes:
   forming a third conductive layer;
   forming a second insulating layer over the third conductive layer; and
   forming a fourth conductive layer over the second insulating layer.

4. The method of claim 1, further including forming a second capacitor in the first interconnect structure.

5. The method of claim 1, further including forming a second interconnect structure over a second surface of the encapsulant opposite the first interconnect structure.

6. The method of claim 5, further including forming a conductive pillar within the encapsulant between the first and second interconnect structures.

7. The method of claim 1, further including forming an insulating layer around the conductive pillar.

8. A method of making a semiconductor device, comprising:
   providing a semiconductor die;
   forming a first capacitor over the semiconductor die;
   depositing an encapsulant over the first capacitor and around the semiconductor die;
   forming a first conductive layer over a first surface of the encapsulant;
   forming a first insulating layer over the first conductive layer; and
   forming a second conductive layer over the first insulating layer, the second conductive layer having a portion formed a predetermined distance away from a footprint of the semiconductor die and wound to operate as an inductor, the portion of the second conductive layer being electrically connected to the first conductive layer.

9. The method of claim 8, wherein the portion of the first conductive layer wound to operate as an inductor is at least 50 micrometer away from the footprint of the semiconductor die.

10. The method of claim 8, wherein forming the first capacitor includes:
    forming a third conductive layer;
    forming a second insulating layer over the third conductive layer; and
    forming a fourth conductive layer over the second insulating layer.

11. The method of claim 8, further including forming a second capacitor with the first conductive layer, first insulating layer, and second conductive layer.

12. The method of claim 8, further including:
    forming an interconnect structure over a second surface of the encapsulant opposite the first conductive layer; and
    forming a conductive pillar within the encapsulant.

13. The method of claim 8, wherein the encapsulant has a higher resistivity than a resistivity of the semiconductor die.

14. A method of making a semiconductor device, comprising:
    providing a semiconductor die;
    forming a capacitor over the semiconductor die;
    depositing an encapsulant over the capacitor and around the semiconductor die; and
    forming a first interconnect structure over a first surface of the encapsulant, includes:
    (a) forming a first conductive layer over the first surface of the encapsulant;
    (b) forming a first insulating layer over the first conductive layer; and
    (c) forming a second conductive layer over the first insulating layer, the second conductive layer having a portion formed a predetermined distance away from a footprint of the semiconductor die and wound to operate as an inductor.

15. The method of claim 14, wherein the portion of the second conductive layer is electrically connected to the capacitor by the first conductive layer.

16. The method of claim 14, wherein the portion of the first conductive layer wound to operate as an inductor is at least 50 micrometer away from the semiconductor die.

17. The method of claim 14, wherein forming the capacitor includes:
    forming a third conductive layer;
    forming a second insulating layer over the third conductive layer; and
    forming a fourth conductive layer over the second insulating layer.

18. The method of claim 14, further including:
    forming a second interconnect structure over a second surface of the encapsulant opposite the first interconnect structure; and
    forming a conductive pillar within the encapsulant between the first and second interconnect structures.

19. The method of claim 14, wherein the encapsulant has a higher resistivity than a resistivity of the semiconductor die.

20. A semiconductor device, comprising:
    a semiconductor die;
    a capacitor formed over the semiconductor die;
    an encapsulant deposited over the capacitor and around the semiconductor die; and
    a first interconnect structure formed over a first surface of the encapsulant, the first interconnect structure including,
    (a) an inductor formed a predetermined distance away from a footprint of the semiconductor die,
    (b) a first conductive layer formed over the first surface of the encapsulant,
    (c) a first insulating layer formed over the first conductive layer, and
    (d) a second conductive layer formed over the first insulating layer having a portion wound to operate as the inductor, the portion of the second conductive layer being electrically connected to the capacitor by the first conductive layer.

21. The semiconductor device of claim 20, wherein the portion of the second conductive layer wound to operate as the inductor is at least 50 micrometer away from the footprint of the semiconductor die.

22. The semiconductor device of claim 20, wherein the capacitor includes:
    forming a third conductive layer;
    forming a second insulating layer over the third conductive layer; and
    forming a fourth conductive layer over the second insulating layer.

23. The semiconductor device of claim 20, further including:
    a second interconnect structure over a second surface of the encapsulant opposite the first interconnect structure; and
    a conductive pillar formed within the encapsulant between the first and second interconnect structures.

* * * * *